United States Patent
Zhai et al.

(10) Patent No.: US 6,861,771 B2
(45) Date of Patent: Mar. 1, 2005

(54) ACTIVE VIBRATION ATTENUATION

(75) Inventors: Bao Nian Zhai, Singapore (SG); Ka Shing Kenny Kwan, Singapore (SG); Wen Chen, Singapore (SG); Gang Ou, Singapore (SG); You Yong Liao, Singapore (SG)

(73) Assignee: ASM Technology Singapore Pte. Ltd., Singapore (SG)

( * ) Notice: Subject to any disclaimer, the term of this patent is extended or adjusted under 35 U.S.C. 154(b) by 0 days.

(21) Appl. No.: 10/402,184

(22) Filed: Mar. 26, 2003

(65) Prior Publication Data

US 2004/0189101 A1 Sep. 30, 2004

(51) Int. Cl.[7] .......................... B41J 23/00; H02K 33/18
(52) U.S. Cl. .......................... 310/12; 438/617; 228/4.5; 228/180.5; 318/135
(58) Field of Search .......................... 310/12; 318/135; 228/180.5, 4.5; 438/617

(56) References Cited

U.S. PATENT DOCUMENTS

| | | | | |
|---|---|---|---|---|
| 4,352,048 A | * | 9/1982 | Schulze | 318/135 |
| 4,555,052 A | * | 11/1985 | Kurtz et al. | 228/104 |
| 5,208,497 A | * | 5/1993 | Ishii et al. | 310/12 |
| 5,231,336 A | | 7/1993 | van Namen | 318/128 |
| 6,028,376 A | * | 2/2000 | Osanai et al. | 310/12 |
| 6,417,914 B1 | * | 7/2002 | Li | 355/75 |
| 6,668,449 B2 | * | 12/2003 | Rumsey et al. | 29/840 |
| 6,669,076 B2 | * | 12/2003 | Nogawa | 228/4.5 |
| 6,674,085 B2 | * | 1/2004 | Miura et al. | 250/442.11 |

\* cited by examiner

Primary Examiner—Thanh Lam
Assistant Examiner—Judson H. Jones
(74) Attorney, Agent, or Firm—Ostrolenk, Faber, Gerb & Soffen, LLP

(57) ABSTRACT

An apparatus and method are provided for attenuating vibration when driving an object. The apparatus includes a driving device for generating a driving force to drive the object and an attenuation actuator mounted in reciprocal relationship with the driving device for generating an attenuation force substantially concurrently with the generation of the driving force. The attenuation force is generated so as to oppose and at least partially cancel a reaction force exerted by the object in response to the driving force.

24 Claims, 3 Drawing Sheets

ACTIVE VIBRATION ATTENUATION

FIELD OF THE INVENTION

The invention relates to the attenuation or reduction of vibration caused when moving a mass with a motor due to a reaction force in response to the driving force. Such vibration attenuation is achievable by attempting to cancel or reduce the effects of such reaction force concurrently with the generation of a driving force to move the mass.

BACKGROUND AND PRIOR ART

According to Newton's third law of motion, for every action, there is an equal and opposite reaction. In practical application in an industrial machine, when a motor is activated to move a mass or object, the object exerts a reaction force on the motor equal to the force generated to the object by the motor. This reaction force acts on the motor as well as on parts connected to the motor. As a result, the reaction force received by the motor, if sufficiently large, causes vibration or shock to the machine.

Vibration and shock are undesirable and will affect machine performance, especially in the semiconductor industry where speed and precision are important. An example is when creating wire bonds to make electrical connections between electrical contacts on a semiconductor die and a leadframe using a wire bonder machine. A motor has to move an object, namely a bond head and attached ultrasonic transducer of the machine, between different predetermined electrical contacts on the die and the leadframe. To achieve higher throughput, the motor has to move the bond head at a high speed. However, reaction forces created by the driving movement acts on the motor and motor platform, causing vibration of the same. Thus, precision may be sacrificed at the expense of speed if such vibration is not attenuated. Conversely, to achieve higher precision, the bond head has to be driven at a lower speed.

A conventional solution is to separate a body of a driving motor from its platform or base. A vibration insulator is inserted between the motor body and its base. In this way, vibration forces from the motor body to the rest of the machine can be dampened by the vibration insulator. However, since the body of the motor is no longer rigidly fixed, there is a need for more critical control requirements and complicated control algorithms.

There have also been attempts in other industries to attempt to cancel vibrational forces. An example of this is described in U.S. Pat. No. 5,231,336 for "Actuator for Active Vibration Control". An electromagnetic actuator is arranged so that a moving element undergoes reciprocal motion in response to an electrical input signal. The moving element is decoupled from any mechanical load in one embodiment so as to produce reaction forces which may be used to cancel vibrational forces. However, a drawback of the device described therein is that it requires a vibration sensor to sense the vibrations of a vibrating surface before the vibrations are processed by a processing unit to produce a suitable feedback. The processing unit generates a driving signal to electromagnetic coils to impart motion to an armature in such a manner as to produce reaction forces to reduce the sensed vibrations. This means that vibrations need to be sensed first, then measured, before a counteracting force is generated to reduce the vibrations. This solution is not sufficiently responsive where vibration forces are continually changing, and there is not sufficient time to sense an amount of vibration before seeking to counteract such vibration.

In the light of the above disadvantages, it would be desirable to develop a solution wherein the effects of vibrational forces are reduced in an efficient and substantially instantaneous manner while having a motor's main body fixed to the rest of the machine for stability.

SUMMARY OF THE INVENTION

It is therefore an objective of the invention to seek to provide an apparatus and method for vibration attenuation such that the effects of reaction forces caused by an object being moved are reduced substantially concurrently with the generation of such reaction or vibrational forces.

According to a first aspect of the invention, there is provided an apparatus for attenuating vibration when driving an object, comprising: driving means for generating a driving force to drive the object and an attenuation actuator mounted in reciprocal relationship with the driving means for generating an attenuation force substantially concurrently with the generation of the said driving force; wherein the attenuation force opposes and at least partially cancels a reaction force exerted by the object in response to the driving force.

According to a second aspect of the invention, there is provided a method for attenuating vibration when driving an object, comprising the steps of: generating a driving force to drive the object; and generating an attenuation force substantially concurrently with the generation of the driving force, such that the attenuation force opposes and at least partially cancels a reaction force exerted by the object in response to the driving force.

It will be convenient to hereinafter describe the invention in greater detail by reference to the accompanying drawings, which illustrate one embodiment of the invention. The particularity of the drawings and the related description is not to be understood as superseding the generality of the broad identification of the invention as defined by the claims.

BRIEF DESCRIPTION OF THE DRAWINGS

Examples of a method and apparatus for attenuation of vibration in accordance with the invention will now be described with reference to the accompanying drawings, in which.

DETAILED DESCRIPTION OF THE PREFERRED EMBODIMENTS

Figure 1:
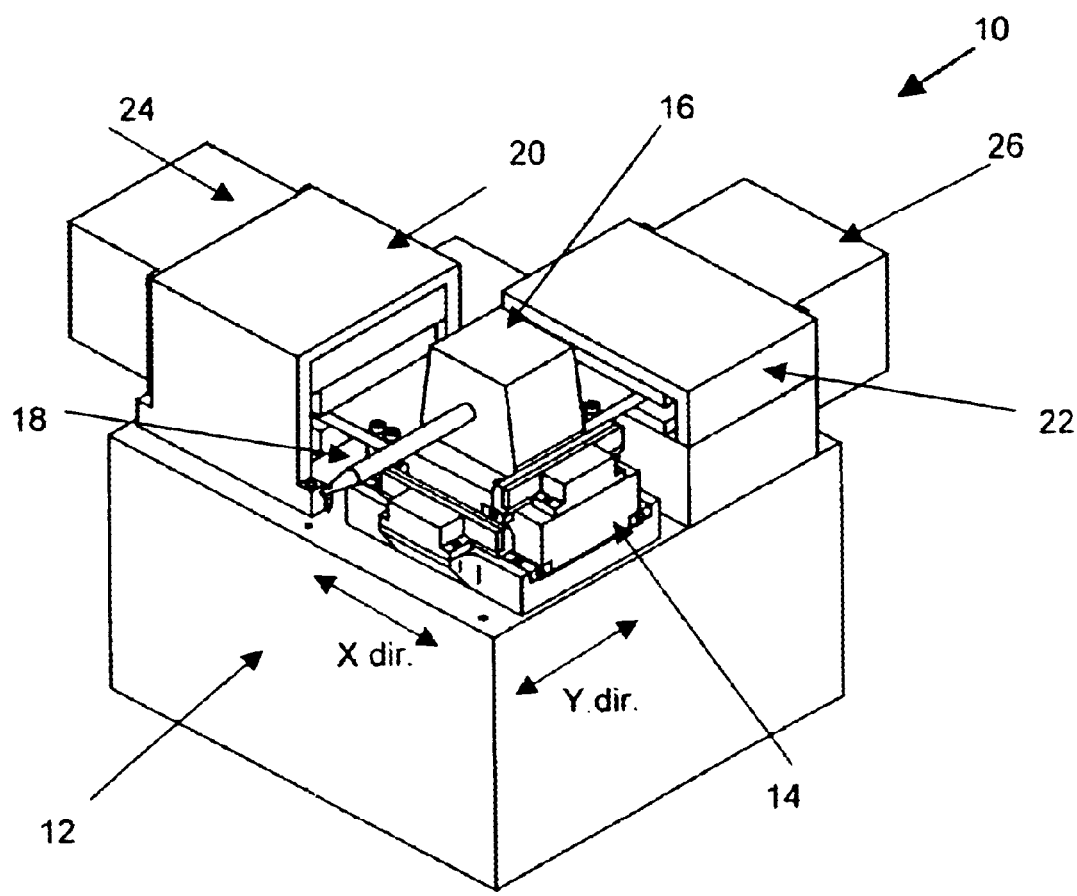
FIG. 1 is an isometric view of an X-Y table of a wire bonder machine incorporating attenuation actuators according to a preferred embodiment of the invention.

FIG. 1 is an isometric view of an X-Y table 10 of a wire bonder machine incorporating attenuation actuators 24, 26 according to a preferred embodiment of the invention. For simplicity of illustration, the rest of the wire bonder machine is not illustrated. The X-Y table 10 comprises generally of an X-Y table base 12, on which is mounted an X-Y stage 14 of the X-Y table. A wire bonder bond head 16 is mounted onto the X-Y stage 14. An ultrasonic transducer 18 for ultrasonically forming wire bonds is mounted on one side of the bond head 16. Movement of the X-Y stage 14 in the X direction or axis and Y direction or axis carries the bond head 16 and ultrasonic transducer 18 to bonding positions on a semiconductor die and leadframe (not shown), whereby wire bonding is performed.

An X motor 20 drives the X-Y stage 14 and bond head 16 in the X direction whereas a Y motor 22 drives X-Y stage 14 and bond head 16 in the Y direction. As the bond head 16 is driven in either direction by the respective motors 20, 22, it generates reaction forces in directions opposite to driving forces from the motors. Consequently, the reaction forces are transmitted through the respective motors 20, 22 to the X-Y table base 12, and the whole X-Y table starts to vibrate. Such vibration may also be transmitted to other parts of the wire bonder machine that are connected to the X-Y table 10. The drawbacks of vibration on the wire bonding process have already been mentioned above. One way to reduce the effects of vibration is to strengthen the rigidity of the X-Y table base 12, but this is not ideal. It would be desirable to seek to at least partially cancel the effects of the reaction forces to limit vibration of the X-Y table 10.

According to the first embodiment of the invention, an X attenuation actuator 24 is attached to the X motor 20 and a Y attenuation actuator 26 is attached to the Y motor 22. The function of the attenuation actuators 24, 26 is to generate a force that opposes the reaction force acting on each of the respective motors 20, 22, that is, in a direction that is opposite to the reaction force. Ideally, the value of the attenuation force is substantially equal to the reaction force, but if that is not possible due to design requirements, the value of the attenuation force may be a portion of the reaction force instead. It is possible to generate an attenuation force that is substantially equal to the reaction force because the reaction force is equal in value to the driving force from the respective motors 20, 22, which is known or determinable. The attenuation actuator 24, 26, is thus designed to produce a force that is essentially equal to the driving force, but mechanically decoupled from the driving force.

Figure 2:
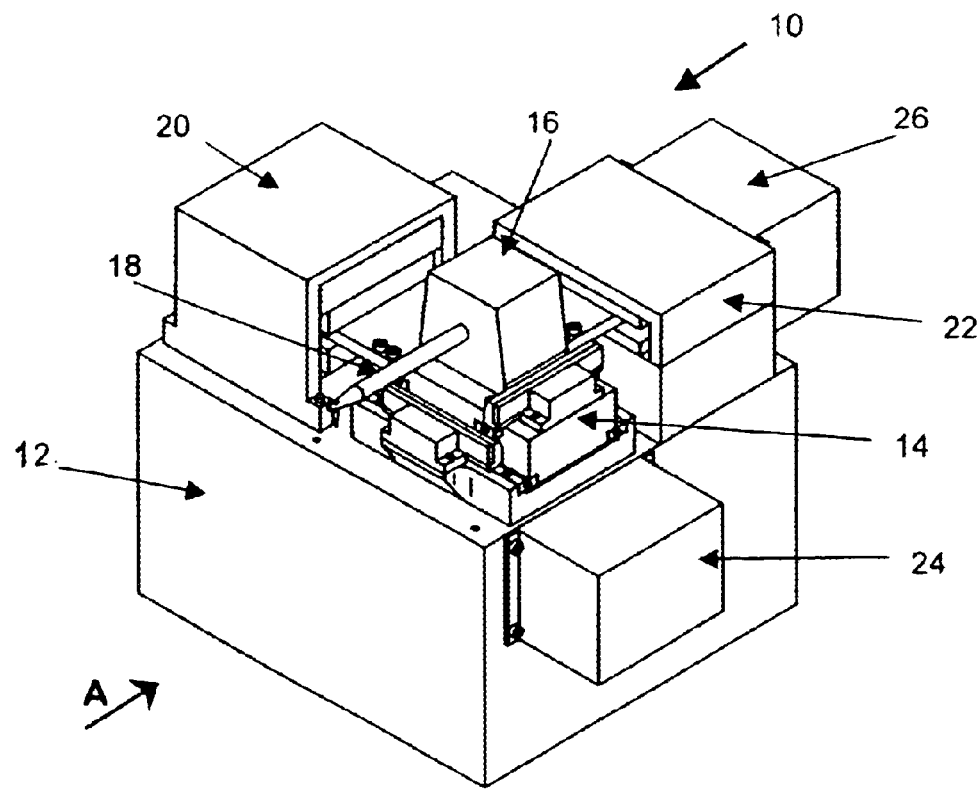
FIG. 2 is an isometric view of the X-Y table incorporating attenuation actuators according to another preferred embodiment of the invention.

FIG. 2 is an isometric view of the X-Y table 10 incorporating attenuation actuators 24, 26 according to another preferred embodiment of the invention. In this embodiment, the X attenuation motor 24 is attached to the X-Y table base 12 instead of to the X motor 20. This layout may be more desirable or necessary if there is insufficient space next to the X motor 20 for attachment of the X attenuation motor 24, or because of other design considerations. For comparison, the Y attenuation actuator 26 is still attached to the Y motor 26. Mechanically, it is more desirable to locate the attenuation motor 24, 26 in alignment with the driving force of the motors 20, 22, since a resulting turning moment may otherwise be present if the force of the attenuation actuator 24 and the reaction force are not aligned, as will be explained in more detail below. Nevertheless, the effect of the reaction force is still significantly reduced notwithstanding the non-alignment. This second embodiment illustrates that the attenuation actuator 24, 26 may be attached at any position in relation to the X-Y table 10, as long as it is capable of producing an attenuation force equal to and in an opposite direction to a reaction force created by a driving motion of the motors 20, 22, and this force can be transmitted to the components affected by the reaction force.

Figure 3:
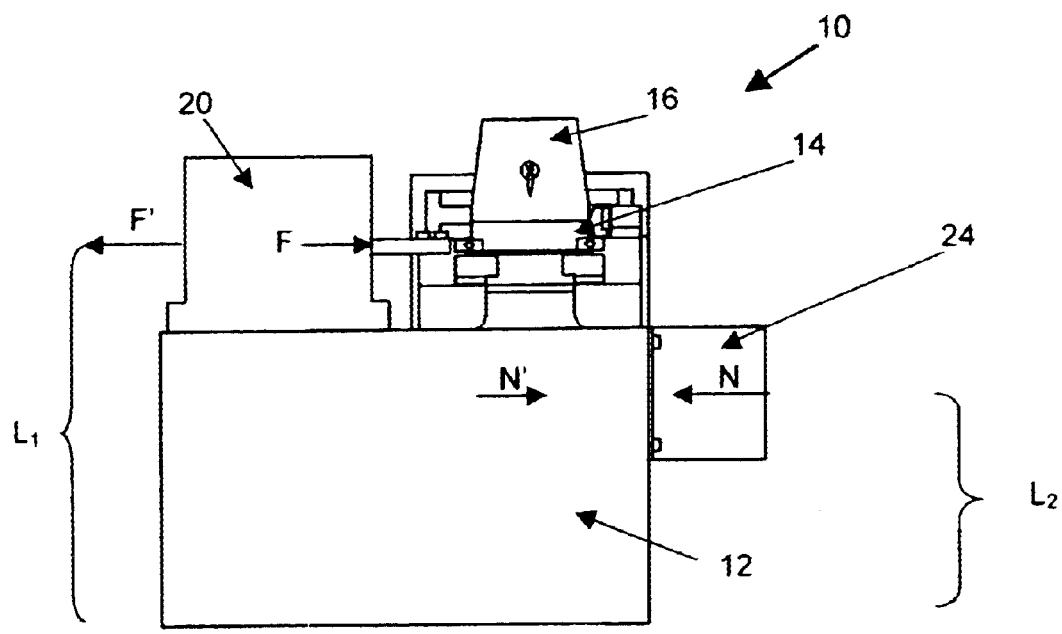
FIG. 3 is a side view of the X-Y table looking from direction A of FIG. 2.

FIG. 3 is a side view of the X-Y table 10 looking from direction A of FIG. 2. This view exclusively illustrates the forces acting in the X direction, but forces acting in the Y direction follow a similar principle. A driving force F is generated by the X motor 20, which creates a reaction force, F'. The X attenuation actuator 24 produces a driving force N, which in turn generates a reaction or cancellation force N' in a direction opposite to that of the reaction force, F'. N' is preferably equal and opposite to F', therefore in essence serving to cancel the effect of the reaction force.

Referring to FIG. 3, the following is a more detailed description of the various forces. The driving force required to drive a mass, such as the bond head 16, in the X direction is F. Therefore, the reaction force acting on the X motor 20 is F'. The attenuation force required to cancel the effect of the reaction force F' is N'. Since the values of these forces are equivalent, F=F'=N=N'.

Assuming that the driving force N of the attenuation actuator is generated by a linear motor, N=SI, where S is the force constant of the attenuation actuator 24, 26, and I is the current flow through the linear motor of the attenuation actuator 24, 26. As the driving force, F, is known or can be determined, the attenuation force N' can be generated accordingly by providing an appropriate current flow I through its motor.

Furthermore, a turning moment is created by the reaction force, which is equivalent to $F' \times L_1$. With the addition of the attenuation actuator 24, 26, the countering turning moment provided by the attenuation force is $N' \times L_2$. In the event, since F'=N', the value of the resultant turning moment is $F' \times (L_1 - L_2)$. The initial turning moment is hence reduced as compared to when there is no attenuation force. It would be appreciated that the smaller the difference between $L_1$ and $L_2$, the lower would be the turning moment. The turning moment may thus be almost eliminated if the attenuation actuator 24, 26 is attached to the respective driving motor 20, 22 as in FIG. 1.

Figure 4:
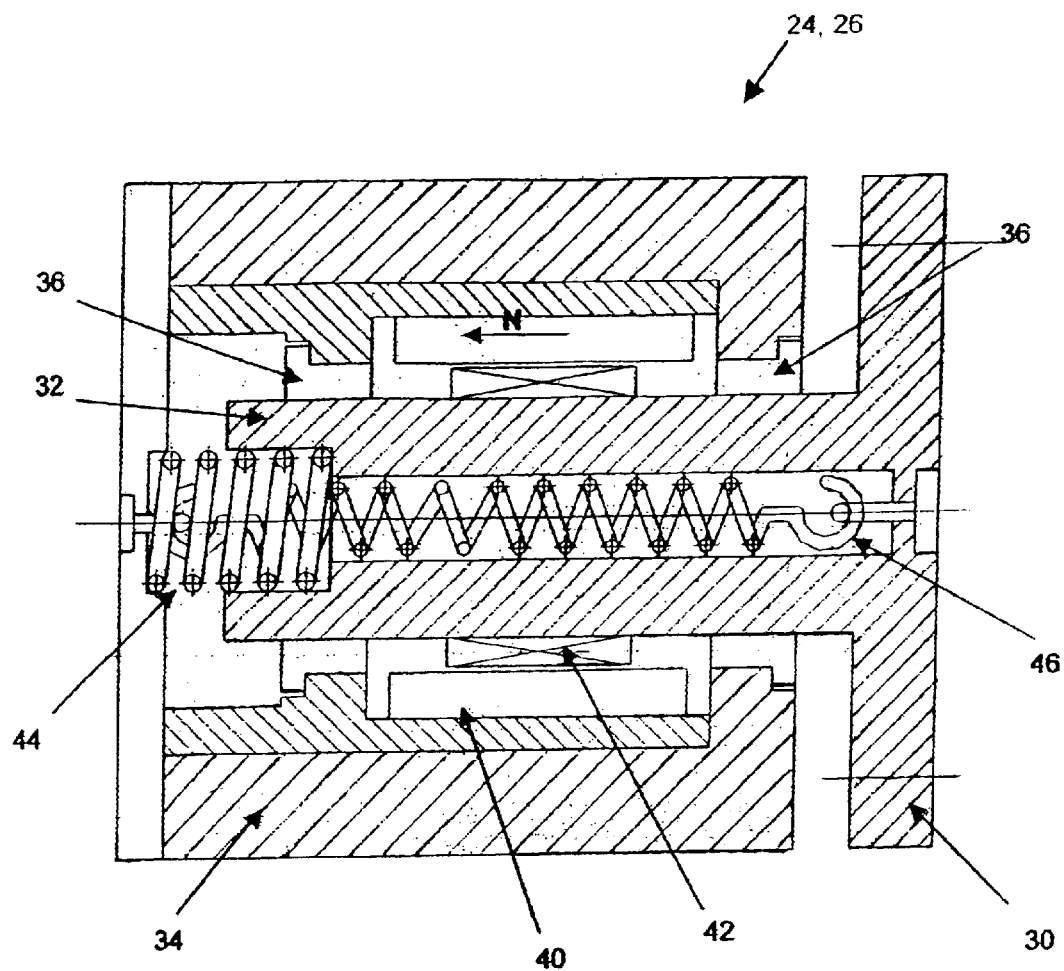
FIG. 4 is a cross-sectional view of an attenuation actuator that may be used with the preferred embodiments of the invention.

FIG. 4 is a cross-sectional view of an attenuation actuator 24, 26 that may be used with the preferred embodiments of the invention. The actuator 24, 26 has a mounting plate 30 for attaching the actuator 24, 26 to a mounting surface, such as a driving motor 20, 22 or an X-Y table base 12. Preferably, the mounting plate 30 is attached to the surface using screws (not shown) although other means of attachment are possible. Extending from the mounting plate 30 is a shaft 32 with a cavity at its center to house a compression spring 44 and an extension spring 46. A moving element 34 is connected by the compression spring 44 and extension spring 46 to the mounting plate 30 and shaft 32. The compression spring 44 and extension spring 46 help to ensure that the moving element 34 is biased at an equilibrium position substantially at the center of the shaft 32 so as to have enough travel distance on either side of the shaft 32 depending on the direction of a force generated.

The moving element 34 substantially covers the shaft 32, and is slidably located along the shaft 32. Bushings 36 help to reduce friction due to the sliding motion. The moving element 34 further incorporates a magnet 40 whereas the shaft incorporates a coil 42. The magnet 40 and coil 42 form an electromagnetic linear motor, wherein the magnet is a movable component. Other configurations are possible, such as a moving coil linear motor. When current is passed through the coil 42 within a field of magnetic flux generated by the magnet 40, an electromagnetic force, N, is created which tends to drive the magnet 40 and moving element 34 in the direction of such force. A reaction force N' is created that is equal and opposite to electromagnetic force N, and N' will serve to counter or cancel the reaction force F' due to the driving force F of a driving motor 20, 22 (see FIG. 3). After discontinuance of the electromagnetic force N, the moving element is moved back to its equilibrium position by the compression spring 44 and extension spring 46.

The attenuation actuator 24, 26 can be introduced as an add-on mechanism for a machine, or built as an integral part of a motor to be mounted onto the machine. Although the attenuation actuator 24, 26 is shown to comprise a linear motor by way of example, it should be appreciated that other types of motors may be used if they are capable of generating a controlled force in an opposite direction to a reaction force. Some examples are pneumatic linear drivers or motors, or rotational electromagnetic motors with linear elements, such as a ball screw. The reaction force attenuation principles herein can also be implemented in other types of machines, with suitable modifications if necessary. The various embodiments of the invention make it possible to cancel the effects of reaction forces significantly. Since the body of the driving motor is rigidly fixed to the machine, the need for feedback control is also obviated.

Another advantage of such apparatus and method is that a machine base need not be as strong as otherwise required because vibration forces are reduced. Furthermore, precision of a machine can be improved as explained above.

The invention described herein is susceptible to variations, modifications and/or additions other than those specifically described and it is to be understood that the invention includes all such variations, modifications and/or additions which fall within the spirit and scope of the above description.

What is claimed is:

1. An apparatus for attenuating vibration when driving a bond head of a wire bonding machine comprising:
    a driving device operative to generate a driving force which drives the bond head; and
    an attenuation actuator mounted in reciprocal relationship with the driving device operative to generate an attenuation force substantially concurrently with the generation of the driving force,
    the attenuation actuator including a linear motor having a shaft and a moving element slidably mounted to the shaft of the motor for generating the attenuation force;
    wherein the attenuation force opposes and at least partially cancels a reaction force exerted by the bond head in response to the driving force.

2. An apparatus according to claim 1, wherein the attenuation actuator comprises a moving magnet linear motor.

3. An apparatus according to claim 1, wherein the attenuation actuator is mounted to driving device.

4. An apparatus according to claim 1, further comprising a base for supporting the driving device, wherein the attenuation actuator is mounted to the base.

5. An apparatus according to claim 1, wherein the driving device comprises a linear motor.

6. An apparatus according to claim 1, wherein the attenuation force is substantially equal to the driving force.

7. An apparatus according to claim 1, further comprising a resilient member which biases the moving element in an equilibrium position relative to the shaft of the linear motor.

8. An apparatus according to claim 7, wherein the resilient member comprises a compression spring and an extension spring connected to the compression spring in series.

9. An apparatus for attenuating vibration when driving an object, comprising:
    a driving device for generating a driving force to drive the object; and
    an attenuation actuator mounted in reciprocal relationship with the driving device for generating an attenuation force substantially concurrently with the generation of the said driving force,
    the attenuation actuator including a moving magnet linear motor having a shaft and a moving element slidably mounted to the shaft of the motor for generating the attenuation force;
    wherein the attenuation force opposes and at least partially cancels a reaction force exerted by the object in response to the driving force.

10. An apparatus according to claim 9, further comprising a resilient member for biasing the moving element in an equilibrium position relative to the shaft of the motor.

11. An apparatus according to claim 10, wherein the resilient member comprises a compression spring and an extension spring connected to the compression spring in series.

12. A method for attenuating vibration when driving a bond head of a wire bonding machine, comprising the steps of:
    generating a driving force to drive the bond head, and
    generating an attenuation force substantially concurrently with the generation of the driving force, such that the attenuation force opposes and at least partially cancels a reaction force exerted by the bond head in response to the driving force,
    the attenuation force being generated by a linear motor having a shaft and a moving element slidably mounted to the shaft.

13. A method according to claim 12, wherein the motor comprises a moving magnet linear motor.

14. A method according to claim 12, wherein the attenuation force is generated in alignment with the driving force.

15. A method according to claim 12, wherein the driving force is generated by a linear motor.

16. A method according to claim 12, wherein the attenuation force is substantially equal to the driving force.

17. A method for attenuating vibration when driving an object, comprising the steps of:
    generating a driving force to drive the object; and
    generating an attenuation force substantially concurrently with the generation of the driving force, such that the attenuation force opposes and at least partially cancels a reaction force exerted by the object in response to the driving force,
    the attenuation force being generated by a moving magnet linear motor having a shaft and a moving element slidably mounted to the shaft.

18. A method according to claim 17, further comprising the step of biasing the moving element in an equilibrium position relative to the shaft of the motor.

19. A method according to claim 18, wherein the biasing step is performed by a resilient member comprising a compression spring and an extension spring connected to the compression spring in series.

20. An apparatus for attenuating vibration when driving a bond head, comprising:
    a driving device for generating a driving force to drive the bond head;
    an attenuation actuator mounted in reciprocal relationship with the driving device for generating an attenuation force substantially concurrently with the generation of the driving force,
    the attenuation actuator including a motor having a shaft and a moving element slidably mounted to the shaft for generating the attenuation force; and a resilient member for biasing the moving element in an equilibrium position relative to the shaft of the motor;

wherein the attenuation force opposes and at least partially cancels a reaction force exerted by the bond head in response to the driving force.

21. The apparatus of claim 20, wherein the motor of the attenuation actuator is selected from the group consisting of a pneumatic motor, linear motor and rotational motor.

22. The apparatus of claim 20, wherein the resilient member comprises a compression spring and an extension spring connected to the compression spring in series.

23. An apparatus for attenuating vibration when driving a bond head, comprising:

a first driving device operative to generate a first driving force which drives the bond head along a first linear axis;

a second driving device operative to generate a second driving force which drives the bond head along a second linear axis which is perpendicular to the first linear axis; and first and a second attenuation actuators respectively mounted in reciprocal relationship with the first and second driving devices, the first and a second attenuation actuators being operative to generate attenuation forces substantially concurrently with the generation of the first and second driving forces, and in respective opposition thereto, wherein the first and second attenuation actuators each include a linear motor having a shaft and a moving element slidably mounted to the shaft for generating the attenuation forces; and are each configured and positioned to at least partially cancel a reaction force exerted by the bond head in response to the driving forces.

24. A method for attenuating vibration when driving a bond head of a wire bonding machine, the method comprising the steps of:

generating a first driving force to drive the bond head along a first linear axis;

generating a second driving force to drive the bond head along a second linear axis which is perpendicular to the first linear axis;

generating first and second attenuation forces substantially concurrently with the generation of the first and second driving forces, and in respective opposition thereto, wherein:

the first and second attenuation forces are generated by respective linear motors, each having a shaft and a moving element slidably mounted to the shaft for generating the attenuation forces; and the first and second attenuating forces are so directed, and of such a magnitude as to at least partially cancel respective reaction force exerted by the bond head in response to the first and second driving forces.

* * * * *